United States Patent
Bae

(10) Patent No.: US 12,425,031 B2
(45) Date of Patent: Sep. 23, 2025

(54) INVERTER AND BOOTSTRAP INVERTER WITH IMPROVED OUTPUT CHARACTERISTICS

(71) Applicant: Hoseo University Academic Cooperation Foundation, Anyang-si (KR)

(72) Inventor: Byung Seong Bae, Anyang-si (KR)

(73) Assignee: HOSEO UNIVERSITY ACADEMIC COOPERATION FOUNDATION, Asan-si (KR)

( * ) Notice: Subject to any disclaimer, the term of this patent is extended or adjusted under 35 U.S.C. 154(b) by 0 days.

(21) Appl. No.: 18/901,088

(22) Filed: Sep. 30, 2024

(65) Prior Publication Data
US 2025/0023555 A1    Jan. 16, 2025

Related U.S. Application Data

(63) Continuation of application No. PCT/KR2022/005509, filed on Apr. 18, 2022.

(30) Foreign Application Priority Data

Mar. 30, 2022   (KR) ........................ 10-2022-0039900

(51) Int. Cl.
*H03K 19/20*    (2006.01)
*H03K 19/017*   (2006.01)

(52) U.S. Cl.
CPC ........... *H03K 19/20* (2013.01); *H03K 19/017* (2013.01)

(58) Field of Classification Search
CPC ... H03K 19/017; H03K 19/0948; H03K 19/20
See application file for complete search history.

(56) References Cited

U.S. PATENT DOCUMENTS

2024/0348238 A1 * 10/2024 Bae ........................ H03K 19/00

FOREIGN PATENT DOCUMENTS

KR         19980067510 A    * 10/1998

* cited by examiner

*Primary Examiner* — Patrick O Neill
(74) *Attorney, Agent, or Firm* — LEX IP MEISTER, PLLC

(57) ABSTRACT

The present invention provides an inverter and a bootstrap inverter with improved output characteristics. The inverter comprises a first and second load transistors, a driving transistor, and a control transistor. The control transistor, when turned on, effectively grounds the source of the first load transistor, ensuring a 0V output. The bootstrap inverter further includes a bootstrap transistor and a capacitor. This configuration solves the problems of output voltage being lower than VDD for logic '1' and not completely 0V for logic '0', achieving ideal output levels.

2 Claims, 10 Drawing Sheets

INVERTER AND BOOTSTRAP INVERTER WITH IMPROVED OUTPUT CHARACTERISTICS

BACKGROUND OF THE INVENTION

1. Field of the Invention

The present invention relates to an inverter and a bootstrap inverter, and more specifically, to an inverter and a bootstrap inverter with improved output characteristics by applying a circuit that includes an additional transistor.

2. Description of the Related Art

Digital signals consist of only two values, 0 and 1. An inverter outputs 1 for an input of 0 and outputs 0 for an input of 1. The truth table and symbols are as shown in Table 1.

TABLE 1

| input | Output |
|-------|--------|
| 0 | 1 |
| 1 | 0 |

A typical method of configuring an inverter is a CMOS inverter which connects a P-channel transistor and an N-channel transistor. FIG. 1 shows a circuit diagram of a CMOS inverter.

FIG. 2 shows a graph of the input voltage and the output voltage when the input voltage of the inverter in FIG. 1 is increased from 0V to the power supply voltage VDD. When the power supply voltage VDD is regarded as the digital signal '1' and 0V is corresponded to the digital signal '0', if the input is 0, the PMOSFET is turned on and the NMOSFET is turned off, so that the output voltage is formed at VDD and the output becomes '1'. Conversely, when the input is '1', the input voltage is VDD, the PMOSFET is turned off, and the NMOSFET is turned on, so that the output voltage is formed at 0V and the output state becomes '0'. Such a CMOS circuit can also be configured with thin film transistors, and can be configured using a P-channel thin film transistor and an N-channel thin film transistor.

FIG. 3 illustrates an example of an inverter configured with an N-channel enhancement-type transistor. The Q2 transistor is called a load transistor, and the Q1 transistor is called a driving transistor. Referring to FIG. 3, in the N-channel inverter, a resistor can be substituted for the Q2 transistor to form an inverter, but the resistor occupies a large area, so the transistor is used to configure the minimum area. An inverter is a basic circuit that constitutes a logic circuit, and assuming that the power supply voltage VDD is in the state of '1' and the input voltage 0V is in the state of '0', it should be configured to output '0' when the input is '1' and output '1' when the input is '0'. In FIG. 3, when a voltage of 0V is input, the Q1 transistor becomes off and the output terminal is connected to VDD through the Q2 transistor, so that the output rises to the VDD voltage. However, when the output voltage becomes the power supply voltage VDD minus the threshold voltage of the Q2 transistor, the Q2 transistor becomes off, so the output stops rising and the output voltage becomes VDD-Vth. A circuit that solves this problem is an inverter using a bootstrap.

FIG. 4 shows a circuit diagram of a bootstrap inverter. Referring to FIG. 4, when the input voltage Vin becomes 0 and the T2 transistor is turned off, the output voltage starts to rise. At this time, the gate voltage of the T1 transistor also rises, and the gate voltage of the T1 transistor becomes higher than VDD. The gate voltage of the T1 transistor becomes higher than VDD by the threshold voltage or more, so that the output voltage becomes VDD.

Referring again to FIG. 3, when the input becomes VDD, the Q1 transistor is turned on and the output voltage is lowered. Since the output node is a point where the Q2 transistor and the Q1 transistor are connected in series, the output voltage is determined by the resistance ratio of the Q2 transistor and the Q1 transistor. This can be expressed as [Equation 1].

$$Vout = VDD[R_{Q1}/(R_{Q1}+R_{Q2})] \quad \text{[Equation 1]}$$

Referring to [Equation 1], the smaller $R_{Q1}$ and the larger $R_{Q2}$, the closer the output voltage is to 0V. However, if $R_{Q2}$ is large, when the output becomes VDD, the output current flows through $R_{Q2}$, so there is a disadvantage that the output current becomes small. In an inverter circuit using only N-channels, the output voltage should be 0 when the output is 0, but since the output voltage is determined by the resistance ratio of the Q2 transistor and the Q1 transistor, a complete 0 output is not formed. Therefore, the conventional inverter has a problem that the output voltage is slightly higher than the complete 0V.

With this background, the applicant has devised a circuit in which the output voltage is completely 0V when the output is '0' even in an inverter configured only with N-channel transistors.

SUMMARY OF THE INVENTION

The present invention aims to solve the problem that the output voltage becomes smaller than VDD when the output is logic '1' in an inverter. In addition, the present invention aims to solve the problem that the output voltage does not become completely 0V when the output is logic '0' in an inverter.

To accomplish this objective, there is provided an inverter, comprising: a first load transistor having a gate electrode and a drain electrode connected to a power supply voltage (VDD) terminal; a second load transistor having a gate electrode and a drain electrode connected to a source electrode of the first load transistor, and a source electrode connected to an output terminal; a driving transistor having a drain electrode connected to a source electrode of the second load transistor to constitute the output terminal, a gate electrode connected to an input (Vin) terminal, and a source electrode connected to a ground (GND) terminal; and a control transistor having a drain electrode connected to the source electrode of the first load transistor, a gate electrode connected to the input (Vin) terminal, and a source electrode connected to the ground (GND) terminal.

In the inverter, the control transistor, when its gate electrode is turned on, may connect the source electrode of the first load transistor to the ground (GND) terminal, thereby ensuring that the voltage at the node (P), where the drain electrode of the second load transistor connected to the output terminal and the source electrode of the first load transistor are connected, becomes 0V.

There is also provided a bootstrap inverter, comprising: a first load transistor having a drain electrode connected to a power supply voltage (VDD) terminal and a gate electrode; a second load transistor having a drain electrode connected to the source electrode of the first load transistor, and a source electrode connected to an output terminal, the gate electrode of the first load transistor being connected to a gate electrode of the second load transistor; a bootstrap transistor having a gate electrode and a drain electrode connected to the power supply voltage (VDD) terminal, and a source electrode connected to the gate electrode of the second load transistor; a driving transistor having a drain electrode connected to the source electrode of the second load transistor to constitute the output terminal, a gate electrode connected to an input (Vin) terminal, and a source electrode connected to a ground (GND) terminal; and a control transistor having a drain electrode connected to the source electrode of the first load transistor, a gate electrode connected to the input (Vin) terminal, and a source electrode connected to the ground (GND) terminal.

The bootstrap inverter may further comprise a capacitor having one end connected to the source electrode of the bootstrap transistor and the other end connected to the output terminal.

According to the present invention, in an inverter configured only with N-channel transistors, the problem that the output '1' state becomes smaller than VDD and the output '0' state does not output completely 0V is solved, thereby implementing an inverter in which the output '1' state is VDD and the output '0' state is a complete 0V. According to the present invention, an inverter with improved output characteristics is provided.

DETAILED DESCRIPTION OF THE INVENTION

Figure 1:
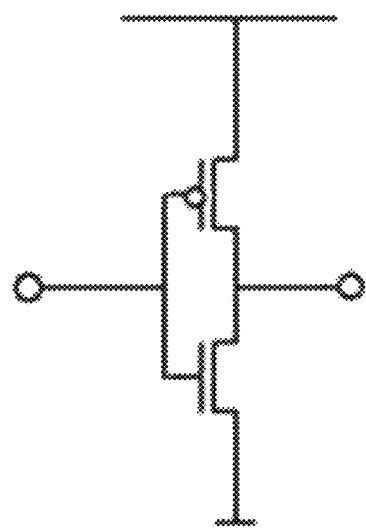
FIG. 1 shows a circuit diagram of a CMOS inverter.
Figure 2:
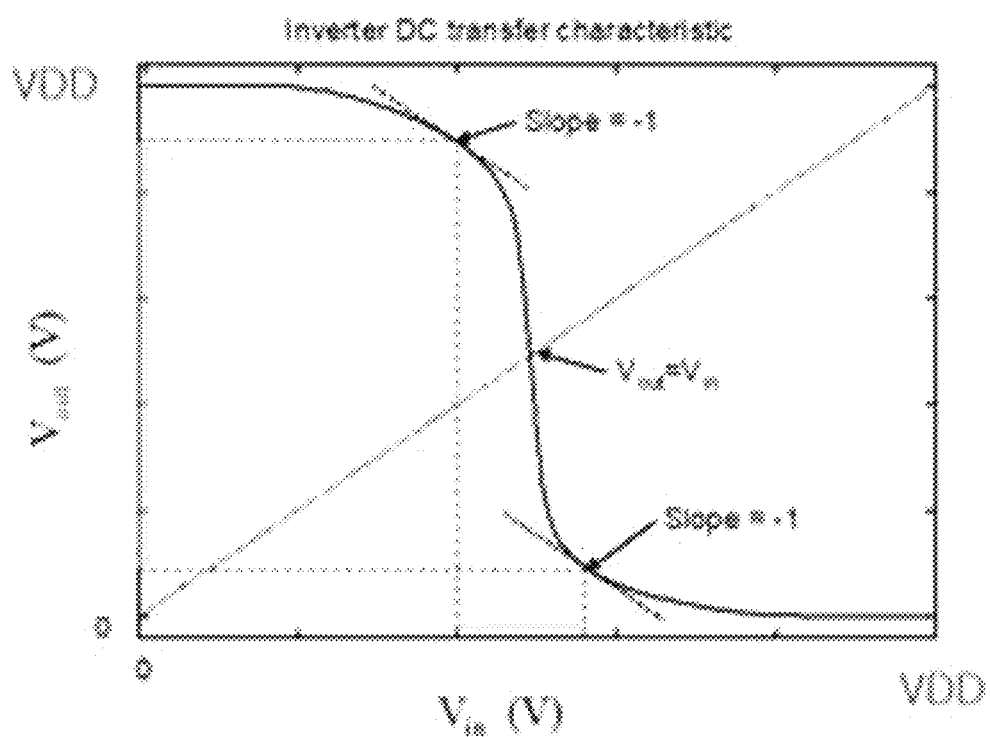
FIG. 2 shows a graph of the input voltage and the output voltage when the input voltage of the inverter in FIG. 1 is increased from 0V to the power supply voltage VDD.
Figure 3:
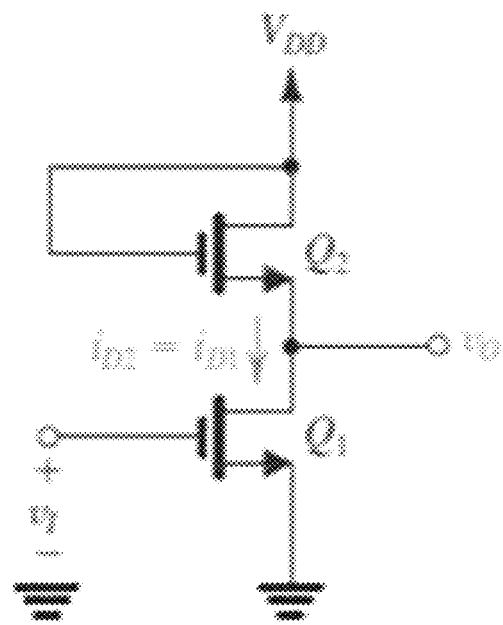
FIG. 3 is an example of an inverter configured with an N-channel enhancement-type transistor.
Figure 4:
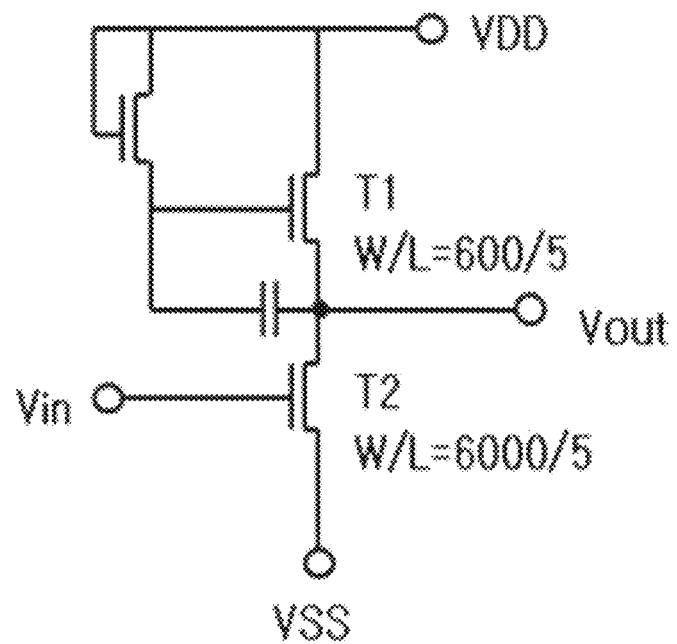
FIG. 4 shows a circuit diagram of a bootstrap inverter.

Hereinafter, exemplary embodiments of the present invention will be described in detail with reference to the accompanying drawings. Prior to the description of the present invention, it will be noted that the terms and wordings used in the specification and the claims should not be construed as general and lexical meanings, but should be construed as the meanings and concepts that agree with the technical spirits of the present invention, based on the principle stating that the concepts of the terms may be properly defined by the inventor(s) to describe the invention in the best manner. Therefore, because the examples described in the specification and the configurations illustrated in the drawings are merely for the preferred embodiments of the present invention but cannot represent all the technical sprints of the present invention, it should be understood that various equivalents and modifications that may replace them can be present.

Figure 5:
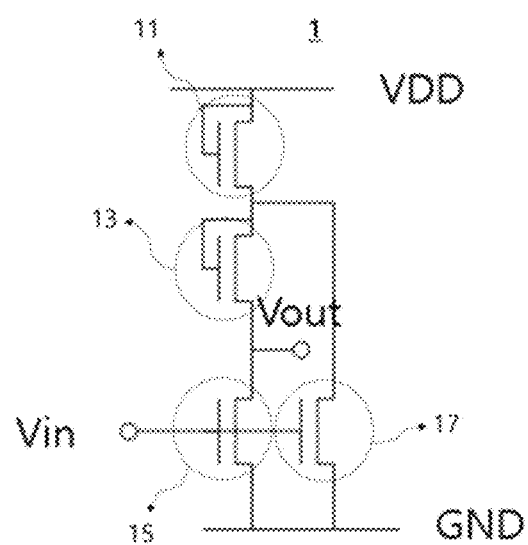
FIG. 5 shows a circuit diagram of an inverter according to an embodiment of the present invention.

FIG. 5 shows a circuit diagram of an inverter 1 according to an embodiment of the present invention.

Referring to FIG. 5, the inverter 1 according to the present embodiment may include a first load transistor 11, a second load transistor 13, a driving transistor 15, and a control transistor 17.

The gate electrode and the drain electrode of the first load transistor 11 are connected to the power supply voltage (VDD) terminal. The gate electrode and the drain electrode of the second load transistor 13 are connected to the source electrode of the first load transistor 11, and the source electrode is connected to the output terminal.

The drain electrode of the driving transistor 15 is connected to the source electrode of the second load transistor 13 to constitute the output terminal, the gate electrode is connected to the input (Vin) terminal, and the source electrode is connected to the ground (GND) terminal.

The drain electrode of the control transistor 17 is connected to the source electrode of the first load transistor 11, the gate electrode is connected to the input (Vin) terminal, and the source electrode is connected to the ground (GND) terminal.

When the gate electrode of the control transistor 17 is turned on, the source electrode of the first load transistor 11 is connected to the ground (GND) terminal so that the voltage of the node (P), where the drain electrode of the second load transistor 13 (connected to the output terminal) and the source electrode of the first load transistor 11 meet, becomes 0V.

Figure 6:
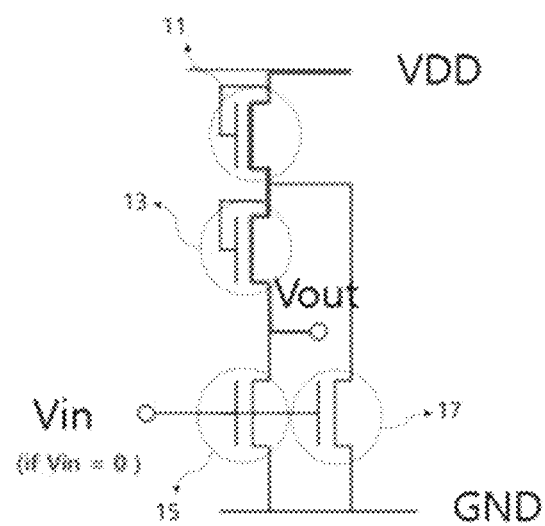
FIG. 6 shows an operation of the inverter of FIG. 5 in an input '0' and output '1' logic.

FIG. 6 shows the operation of the input '0' and output '1' logic in the inverter 1 of FIG. 5.

Referring to FIG. 6, when the input is in the '0' state, the driving transistor 15 and the control transistor 17 are turned off. The output voltage is connected to VDD through the first load transistors 11 and second load transistors 13 in series, causing the output voltage to rise by VDD-Vth. As the output voltage rises by VDD-Vth, the output is in the '1' state.

Figure 7:
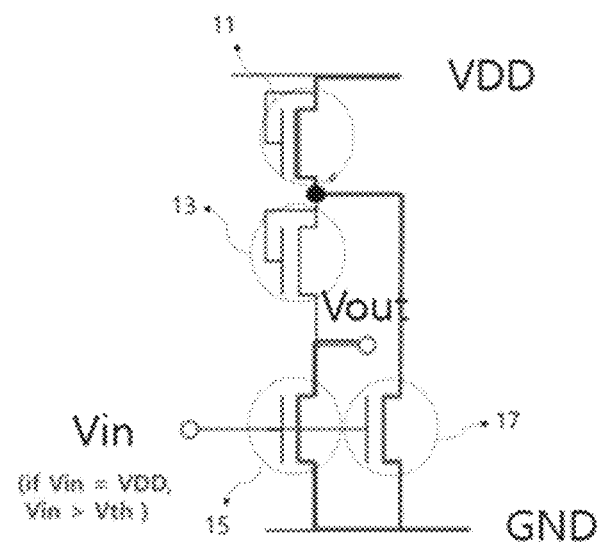
FIG. 7 shows an operation of the inverter of FIG. 5 in an input '1' and output '0' logic.

FIG. 7 shows the operation of the inverter 1 of FIG. 5 in the input '1' and output '0' logic.

Referring to FIG. 7, when the input is in the '1' state, the driving transistor 15 and the control transistor 17 are turned on. It is preferable that the channel width of the control transistor 17 is set to be much larger than the channel widths of the first and second load transistors 11 and 13. In the present embodiment, the resistance of the first and second load transistors 11 and 13 may be set to be much larger than the resistance of the control transistor 17. In this case, the node P connected to the first load transistor 11 and the second load transistor 13 is connected to the ground and becomes 0V. Eventually, since the drain electrode of the driving transistor 15 becomes 0V, the output voltage becomes a complete 0V.

Figure 8:
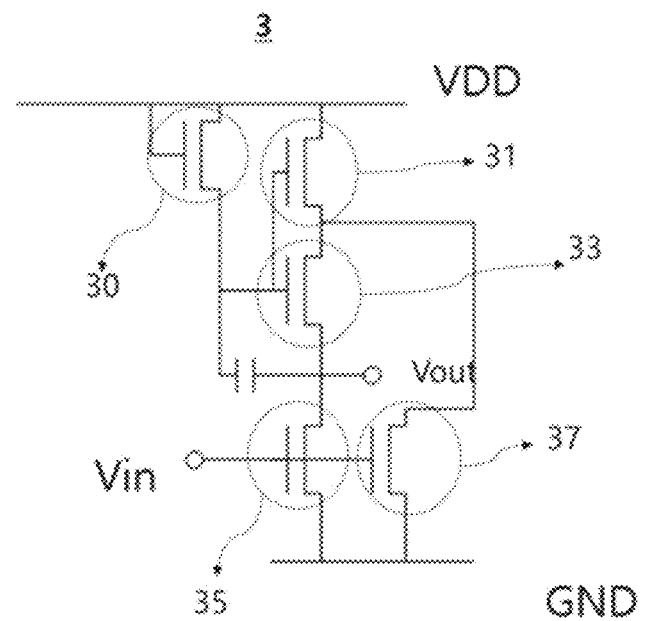
FIG. 8 shows a circuit diagram of a bootstrap inverter according to another embodiment of the present invention.

FIG. 8 shows a circuit diagram of a bootstrap inverter 3 according to another embodiment of the present invention.

Referring to FIG. 8, the bootstrap inverter 3 according to the present embodiment may include: a first load transistor 31 having a gate electrode and a drain electrode connected to a power supply voltage (VDD) terminal; a second load transistor 33 having a drain electrode connected to the source electrode of the first load transistor 31 and a source electrode connected to an output terminal; a bootstrap transistor 30 having a gate electrode and a drain electrode connected to the power supply voltage (VDD) terminal and a source electrode connected to the gate electrode of the second load transistor 33; a driving transistor 35 having a drain electrode connected to the source electrode of the second load transistor 33 to constitute the output terminal, a gate electrode connected to an input (Vin) terminal, and a source electrode connected to a ground (GND) terminal; and a control transistor 37 having a drain electrode connected to the source electrode of the first load transistor 31, a gate electrode connected to the input (Vin) terminal, and a source electrode connected to the ground (GND) terminal. Further, the bootstrap inverter 3 may further include a capacitor having one end connected to the source electrode of the bootstrap transistor and the other end connected to the output terminal.

Figure 9:
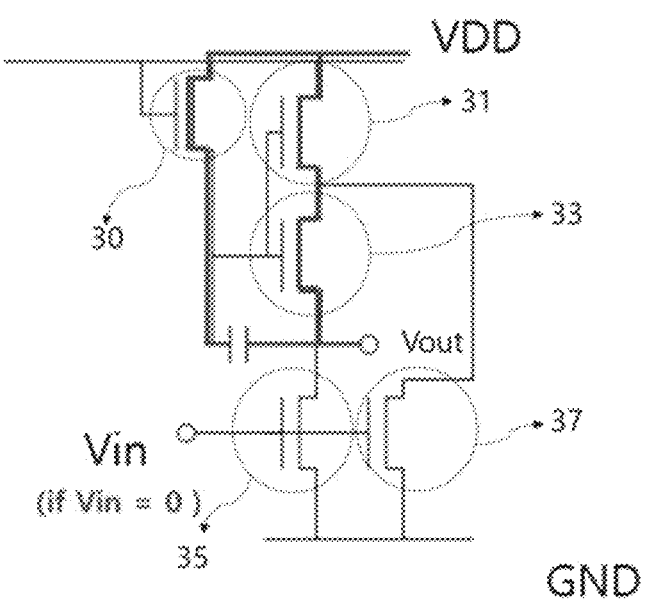
FIG. 9 shows an operation of the inverter of FIG. 8 in an input '0' and output '1' logic.

FIG. 9 shows the operation of the bootstrap inverter 3 of FIG. 8 in the input '0' and output '1' logic.

Referring to FIG. 9, when the input is in the '0' state, the driving transistor 35 and the control transistor 37 are in the off state. The VDD voltage is connected to the output through the first load transistor 31 and the second load transistor 33, so that the output voltage rises. At this time, as the output voltage rises, the gate voltages of the first and second load transistors 31 and 33 also rise due to the bootstrap transistor 30, and the output voltage rises all the way to VDD, so that the output voltage becomes the '1' state which is VDD.

Figure 10:
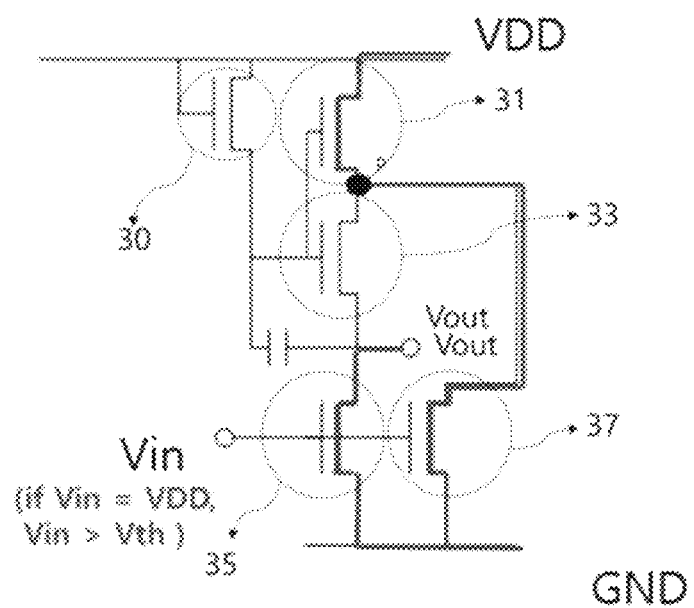
FIG. 10 shows an operation of the inverter of FIG. 8 in an input '1' and output '0' logic.

FIG. 10 shows the operation of the bootstrap inverter 3 in the input '1' and output '0' logic.

Referring to FIG. 10, when the input voltage is VDD in the '1' state, both the driving transistor 35 and the control transistor 37 are turned on. As a result, the voltage of the node P connected to the first and second load transistors 31 and 33 becomes 0V, and the output voltage becomes 0V. Therefore, when the input is in the '1' state, the output voltage is 0V, so that the ideal '0' logic can be driven.

As shown above, although the present invention has been described by means of limited embodiments and drawings, the invention is not limited thereby and various modifications and variations can be made by one having ordinary knowledge in the technical field to which the invention belongs within the equitable scope of the technical idea of the invention and the claims of the patent which will be described below.

What is claimed is:

1. An inverter, comprising:
   a first load transistor having a gate electrode and a drain electrode connected to a power supply voltage (VDD) terminal;
   a second load transistor having a gate electrode and a drain electrode connected to a source electrode of the first load transistor, and a source electrode connected to an output terminal;
   a driving transistor having a drain electrode connected to a source electrode of the second load transistor to constitute the output terminal, a gate electrode connected to an input (Vin) terminal, and a source electrode connected to a ground (GND) terminal; and
   a control transistor having a drain electrode connected to the source electrode of the first load transistor, a gate electrode connected to the input (Vin) terminal, and a source electrode connected to the ground (GND) terminal.

2. The inverter of claim 1, wherein the control transistor, when its gate electrode is turned on, effectively connects the source electrode of the first load transistor to the ground (GND) terminal, thereby ensuring that the voltage at a node (P), where the drain electrode of the second load transistor connected to the output terminal and the source electrode of the first load transistor are connected, becomes 0V.

* * * * *